United States Patent
Takahashi

(10) Patent No.: US 8,461,942 B2
(45) Date of Patent: Jun. 11, 2013

(54) SURFACE ACOUSTIC WAVE DEVICE

(75) Inventor: Naoki Takahashi, Yokohama (JP)

(73) Assignee: Taiyo Yuden Co., Ltd., Tokyo (JP)

(*) Notice: Subject to any disclaimer, the term of this patent is extended or adjusted under 35 U.S.C. 154(b) by 342 days.

(21) Appl. No.: 12/796,205

(22) Filed: Jun. 8, 2010

(65) Prior Publication Data

US 2010/0308936 A1  Dec. 9, 2010

(30) Foreign Application Priority Data

Jun. 9, 2009  (JP) ................................. 2009-138597

(51) Int. Cl.
*H03H 9/64* (2006.01)

(52) U.S. Cl.
USPC ................... 333/195; 333/193; 310/313 D

(58) Field of Classification Search
USPC ............... 333/193–196; 310/313 B, 313 D
See application file for complete search history.

(56) References Cited

U.S. PATENT DOCUMENTS

| | | | |
|---|---|---|---|
| 3,582,840 A * | 6/1971 | DeVries ...................... | 333/193 |
| 6,731,188 B2 * | 5/2004 | Sawada et al. ................ | 333/193 |
| 6,771,145 B2 * | 8/2004 | Ouchi et al. .................. | 333/195 |
| 6,919,781 B2 * | 7/2005 | Baier et al. ................... | 333/195 |
| 2002/0000898 A1 * | 1/2002 | Takamine ..................... | 333/195 |
| 2002/0145361 A1 * | 10/2002 | Shibata et al. ............. | 310/313 C |
| 2002/0163403 A1 | 11/2002 | Sawada et al. | |
| 2003/0155993 A1 | 8/2003 | Takamine et al. | |
| 2003/0227359 A1 | 12/2003 | Ouchi | |
| 2004/0000839 A1 * | 1/2004 | Shibata et al. ............. | 310/313 B |
| 2004/0000842 A1 | 1/2004 | Yata | |
| 2004/0080383 A1 | 4/2004 | Takamine | |
| 2007/0126531 A1 | 6/2007 | Yata | |
| 2007/0236308 A1 | 10/2007 | Takamine | |
| 2007/0279157 A1 | 12/2007 | Bauer | |

FOREIGN PATENT DOCUMENTS

| | | |
|---|---|---|
| EP | 1 158 672 A2 | 11/2001 |
| JP | 2002-290205 A | 10/2002 |
| JP | 2003-309448 A | 10/2003 |
| JP | 2004-048675 A | 2/2004 |
| JP | 2004-112594 A | 4/2004 |
| JP | 2007-534243 A | 11/2007 |
| WO | WO 2006/087875 A1 | 5/2006 |
| WO | 2007/040052 A1 | 4/2007 |

OTHER PUBLICATIONS

Japanese Office Action dated Feb. 19, 2013, in a counterpart Japanese patent application No. 2009-138597.

* cited by examiner

*Primary Examiner* — Barbara Summons

(74) *Attorney, Agent, or Firm* — Chen Yoshimura LLP

(57) ABSTRACT

A surface acoustic wave device includes a first filter and a second filter, each of them being a surface acoustic wave (SAW) filter including an odd number of at least three Inter-Digital Transducers (IDTs); an unbalanced terminal to which an unbalanced signal is input; a first balanced terminal from which a signal having a same phase as the unbalanced signal is output; and a second balanced terminal from which a signal having an opposite phase to the unbalanced signal is output. One of electrodes of a first center IDT and one of electrodes of a second center IDT are commonly connected to the unbalanced terminal, the first center IDT and the second center IDT being one out of the odd number of IDTs and locating at a center in the first filter and the second filter respectively. The number of electrode fingers of the first center IDT is an odd number, and the number of electrode fingers of the second center IDT is an even number.

7 Claims, 13 Drawing Sheets

US 8,461,942 B2

SURFACE ACOUSTIC WAVE DEVICE

CROSS-REFERENCE TO RELATED APPLICATION

This application is based upon and claims the benefit of priority of the prior Japanese Patent Application No. 2009-138597, filed on Jun. 9, 2009, the entire contents of which are incorporated herein by reference.

FIELD

A certain aspect of the embodiments discussed herein is related to a surface acoustic wave device.

BACKGROUND

In recent years, as wireless communication devices such as cell phones are upgraded, a Surface Acoustic Wave (SAW) device as a component is required to have a function of converting the unbalanced signal to the balanced signal, that is, the balun function. The balun function is achieved by connecting two SAW filters in parallel between an unbalanced terminal and two balanced terminals. An in-band insertion loss is reduced by making the number of electrode fingers of an InterDigital Transducer (IDT) which constructs the SAW filter different between filters. WO 2006/087875 (Document 1) discloses such SAW device.

In the SAW device disclosed in Document 1, both numbers of electrode fingers of IDTs constructing two SAW filters are an even number, or an odd number. In this case, a notch may be generated in the pass band, and an insertion loss may be deteriorated.

SUMMARY

The present invention has been made in view of the above mentioned circumstances and provides a surface acoustic wave device capable of suppressing an in-band notch and reducing an insertion loss.

According to an aspect of the present invention, there is provided a surface acoustic wave device including: a first filter and a second filter, each of them being a surface acoustic wave (SAW) filter including an odd number of at least three InterDigital Transducers (IDTs); an unbalanced terminal to which an unbalanced signal is input; a first balanced terminal from which a signal having a same phase as the unbalanced signal is output; and a second balanced terminal from which a signal having an opposite phase to the unbalanced signal is output. One of electrodes of a first center IDT and one of electrodes of a second center IDT are commonly connected to the unbalanced terminal, the first center IDT and the second center IDT being one out of the odd number of IDTs and located at a center in the first filter and the second filter respectively; one of electrodes in each of two IDTs located on either side of the first center IDT is commonly connected to the first balanced terminal; one of electrodes in each of two IDTs located on either side of the second center IDT is commonly connected to the second balanced terminal; the number of electrode fingers of the first center IDT is an odd number; and the number of electrode fingers of the second center IDT is an even number.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Embodiments of the present invention are described below with reference to the accompanying drawings.

[Comparative Embodiment]

A description will be given of a SAW device in accordance with a comparative embodiment of the present invention first.

Figure 1:
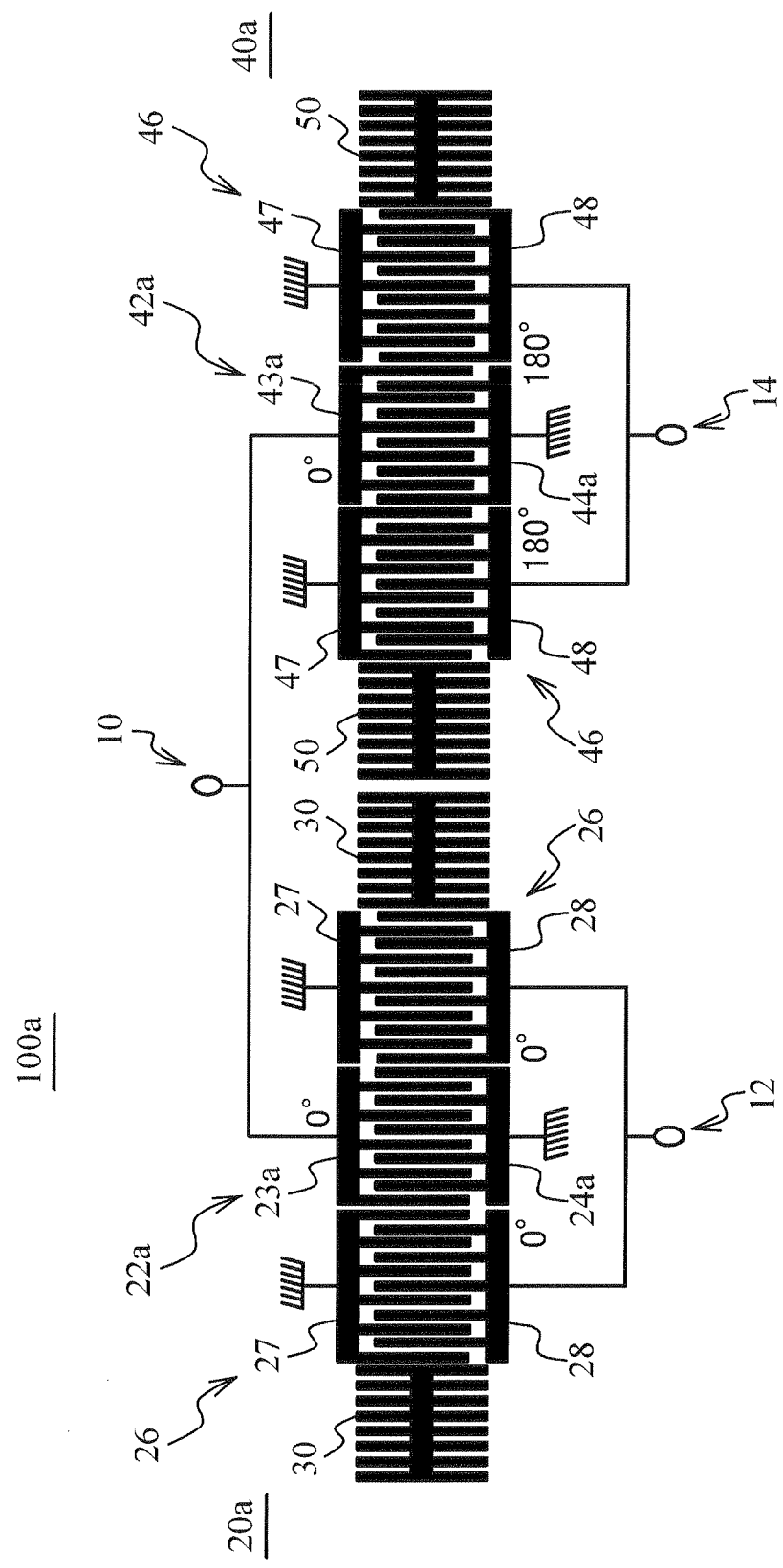
FIG. 1 is a schematic view of a SAW device in accordance with a first comparative embodiment.

FIG. 1 is a top view illustrating a composition of a SAW device 100*a* in accordance with a first comparative embodiment. The SAW device 100*a* includes an input terminal (an unbalanced terminal 10), and two output terminals (a first balanced terminal 12 and a second balanced terminal 14). An unbalanced signal is input to the unbalanced terminal 10. A signal which has the same phase as the signal input to the unbalanced terminal 10 is output from the first balanced terminal 12. A signal which has the opposite phase to the signal input to the unbalanced terminal 10 is output from the second balanced terminal 14.

A first filter 20a which is a SAW filter is connected between the first balanced terminal 12 and the unbalanced terminal 10. The first filter 20a includes three IDTs arranged in the propagation direction of surface acoustic waves, and a pair of reflectors located on either side of IDTs. Hereinafter, the IDT locating at the center (a first center IDT) is referred to as a first input IDT 22a, and other two IDTs locating on either side of the first input IDT 22a are referred to as first output IDTs 26. In each IDT, a pair of comb electrodes facing each other is formed on a piezoelectric substrate so that comb electrodes engage with each other. One of two comb electrodes functions as an input electrode or an output electrode, and the other functions as a ground electrode. Reflectors in the first filter 20a are referred to as first reflectors 30.

In the first input IDT 22a, an input electrode 23a is connected to the unbalanced terminal 10, and a ground electrode 24a is connected to ground. In two first output IDTs 26, ground electrodes 27 are connected to ground, and output electrodes 28 are commonly connected to the first balanced terminal 12. To output the signal having the same phase as the input signal, electrode fingers of ground electrodes 27 are located to adjoin the electrode finger of the input electrode 23a in the first input IDT 22a, or electrode fingers of output electrodes 28 are located to adjoin the electrode finger of the ground electrode 24a in the first input IDT 22a, in first output IDTs 26. In the first input IDT 22a, the number of electrode fingers of the input electrode 23a is same as that of the ground electrode 24a, and the total number of electrode fingers in the IDT is an even number.

A second filter 40a which is a SAW filter is connected between the second balanced terminal 14 and the unbalanced terminal 10. The second filter 40a has a same composition as that of the first filter 20a, and includes three IDTs (a second input IDT 42a and two second output IDTs 46) and a pair of reflectors (second reflectors 50). In the second input IDT 42a (a second center IDT), an input electrode 43a is connected to the unbalanced terminal 10, and a ground electrode 44a is connected to ground. In two second output IDTs 46, ground electrodes 47 are connected to ground, and output electrodes 48 are commonly connected to the second balanced terminal 14. To output the signal having the opposite phase to the input signal, electrode fingers of ground electrodes 47 are located to adjoin the electrode finger of the ground electrode 44a in the second input IDT 42a, or electrode fingers of output electrodes 48 are located to adjoin the electrode finger of the input electrode 43a in the second input IDT 42a, in second output IDTs 46. In the second input IDT 42a, the number of electrode fingers of the input electrode 43a is same as that of the ground electrode 44a, and the total number of electrode fingers in the IDT is an even number.

The SAW device 100a functions as a DMS (Double Mode SAW) filter with a function of converting the unbalanced signal to the balanced signal by including the first filter 20a and the second filter 40a that are connected to the input terminal in parallel. Furthermore, it is possible to reduce an insertion loss in the pass band by arranging the number of electrode fingers of the first input IDT 22a to be different from that of the second input IDT 42a.

However, in the SAW device 100a in accordance with the first comparative embodiment, both numbers of electrode fingers of the first input IDT 22a and the second input IDT 42a are an even number. In such composition, there is a possibility that a notch is generated in the pass band, and an insertion loss is deteriorated. There is a same possibility when both numbers of electrode fingers of the first input IDT 22a and the second input IDT 42a are an odd number.

In following embodiments, descriptions will be given of SAW devices capable of solving the above problem and reducing an insertion loss.

[First Embodiment]

Figure 2:
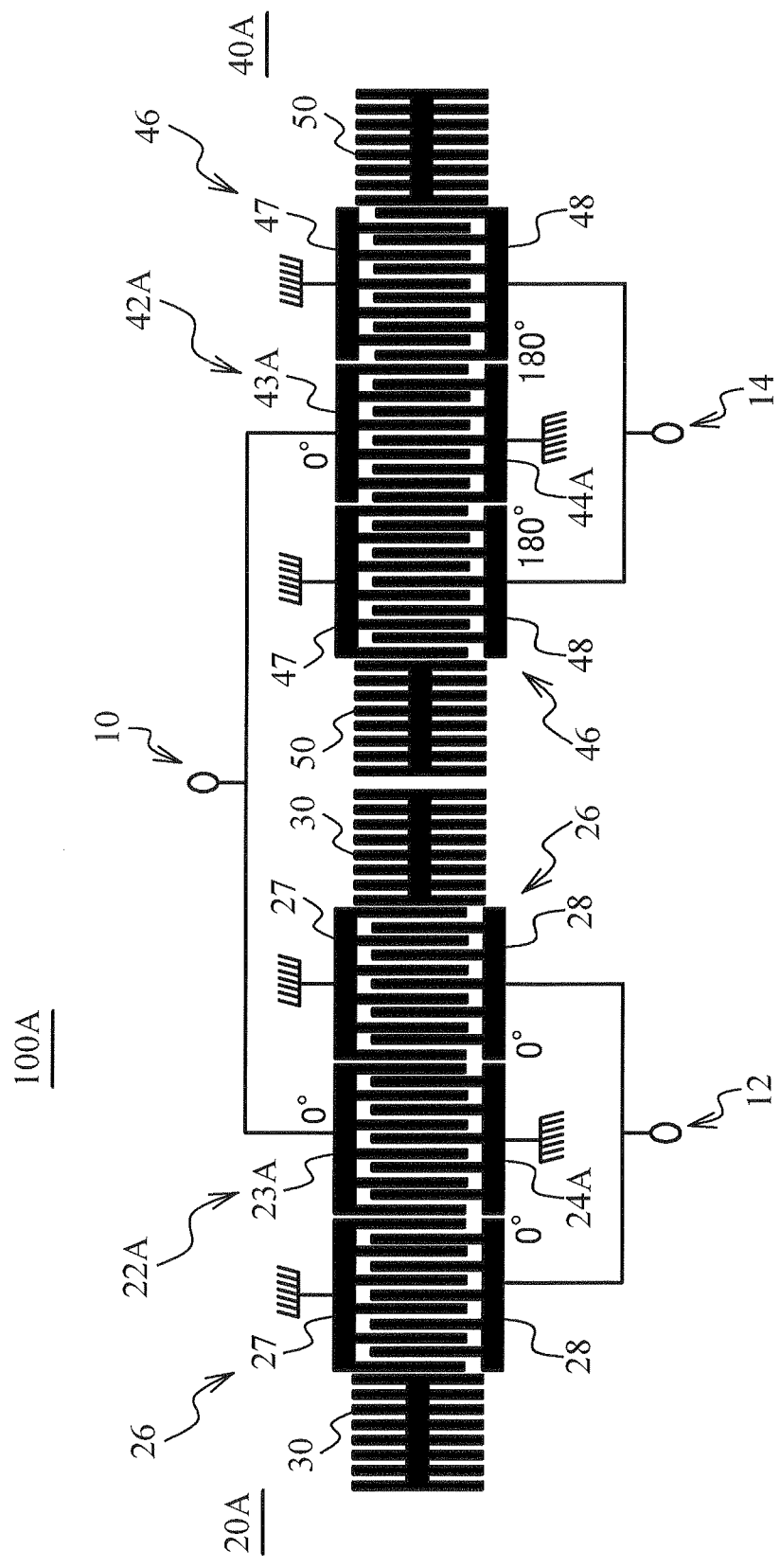
FIG. 2 is a schematic view of a SAW device in accordance with a first embodiment.

FIG. 2 is a top view illustrating a composition of a SAW device 100A in accordance with a first embodiment. The basic composition of the SAW device 100A is same as that of the SAW device 100a in accordance with the first comparative embodiment. Thus, same reference numerals are assigned to common components, and descriptions are omitted.

The composition of a first input IDT 22A in a first filter 20A of the SAW device 100A in accordance with the first embodiment differs from the first input IDT 22a in the first filter 20a of the first comparative embodiment. More specifically, the number of electrode fingers of an input electrode 23A is greater than the number of electrode fingers of a ground electrode 24A, and the total number of electrode fingers in the IDT is an odd number. In a second input IDT 42A, the number of electrode fingers of an input electrode 43A is same as that of a ground electrode 44A, and the total number of electrode fingers in the IDT is an even number as with the first comparative embodiment. That is to say that the number of electrode fingers of the input IDT in the SAW filter which is connected to the terminal outputting the signal having the same phase as the input signal is an odd number, and the number of electrode fingers of the input IDT in the SAW filter which is connected to the terminal outputting the signal having the opposite phase to the input signal is an even number, in this embodiment.

A comparison between transmission characteristics of SAW devices in accordance with the first embodiment and the first comparative embodiment will now be described on the basis of the simulation. In this simulation, the composition of the piezoelectric substrate and that of the electrode are same in the first embodiment and the first comparative embodiment. Details of parameters are shown in Table 1 as follows.

TABLE 1

| | |
|---|---|
| PIEZOELECTRIC SUBSTRATE | 42° Y-X LiTaO$_3$ |
| ELECTRODE | Al (FILM THICKNESS 170 nm) |
| IDT PITCH (FILTER) | 1.96 μm~2.19 μm |
| REFLECTOR PITCH (FILTER) | 2.26 μm |
| NUMBER OF REFLECTORS (FILTER) | 50 |

The numbers of electrode fingers of input IDTs (22 and 42) and output IDTs (26 and 46) in filters (20 and 40), and apertures of two filters are as follows. Two electrode fingers facing each other are counted as a pair when counting the number of electrode fingers. When the number of pairs is an integer, the number of electrode fingers is an even number. When the number of pairs is the number with decimals, the number of electrode fingers is an odd number. Parameters in second and third embodiments and second through fourth comparative embodiments are shown in Table 2, but these are described later. Hereinafter, in a comparison between transmission characteristics of SAW devices, parameters of the first embodiment and the first comparative embodiment are based on a simulation, and other parameters (parameters of second and third embodiments and second through fourth comparative embodiments) are based on measured values.

TABLE 2

| | FIRST AND SECOND COMPARATIVE EMBODIMENTS | THIRD AND FOURTH COMPARATIVE EMBODIMENTS | FIRST EMBODIMENT | SECOND EMBODIMENT | THIRD EMBODIMENT |
|---|---|---|---|---|---|
| FIRST INPUT IDT | 27 PAIRS | 27.5 PAIRS | 24.5 PAIRS | 24.5 PAIRS | 22.5 PAIRS |
| FIRST OUTPUT IDT | 11.5 PAIRS | 11.5 PAIRS | 11.5 PAIRS | 11.5 PAIRS | 11.5 PAIRS |
| SECOND INPUT IDT | 27 PAIRS | 27.5 PAIRS | 21 PAIRS | 21 PAIRS | 23 PAIRS |
| SECOND OUTPUT IDT | 11.5 PAIRS | 11.5 PAIRS | 12.5 PAIRS | 12.5 PAIRS | 11.5 PAIRS |
| APERTURE | 100 μm | 100 μm | 83 μm | 83 μm | 83 μm |

Figure 3:
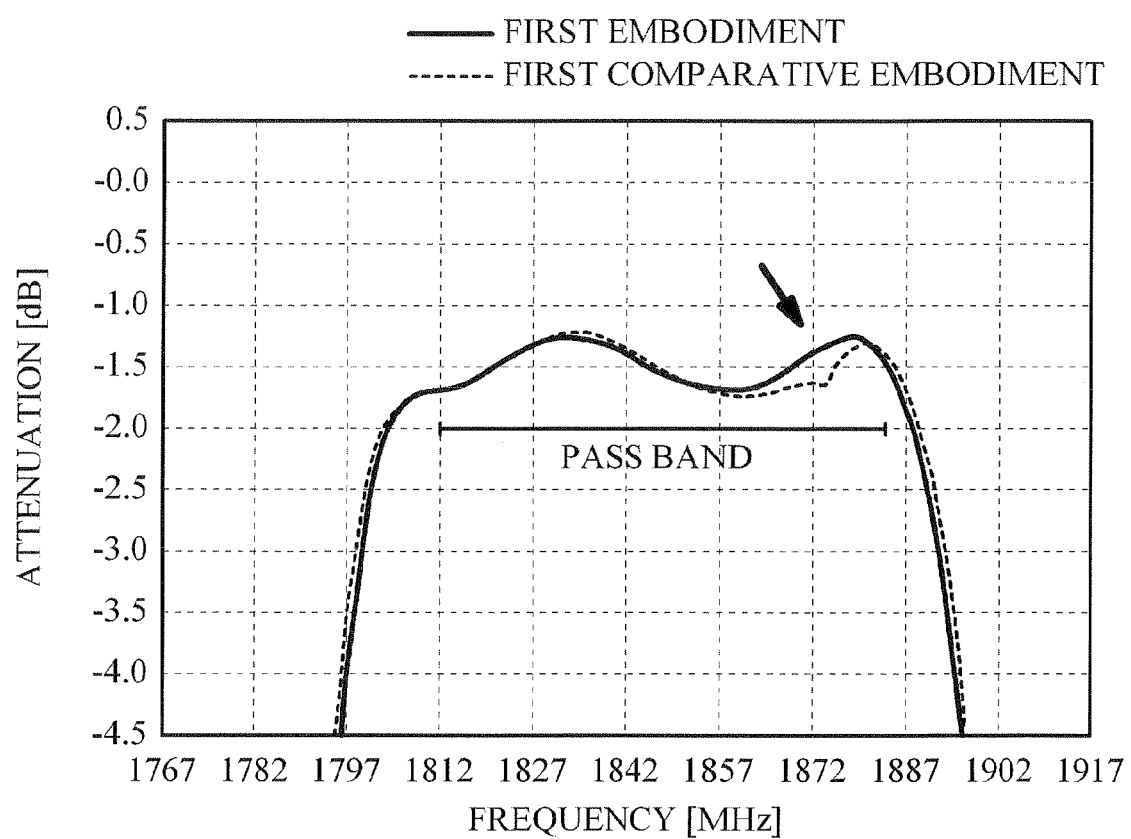
FIG. 3 is a graph illustrating a comparison between transmission characteristics of SAW devices in the first embodiment and the first comparative embodiment.

FIG. 3 is a graph illustrating a comparison between both transmission characteristics. The horizontal axis indicates a frequency, and the vertical axis indicates attenuation. At the point indicated by the arrow in the graph, a notch is suppressed in the first embodiment compared to the first comparative embodiment. As described above, according to the SAW device 100A of the first embodiment, it is possible to suppress an in-band notch and reduce an insertion loss.

[Second Embodiment]

A second embodiment is an example of a SAW device where resonators are combined to filters.

Figure 4:
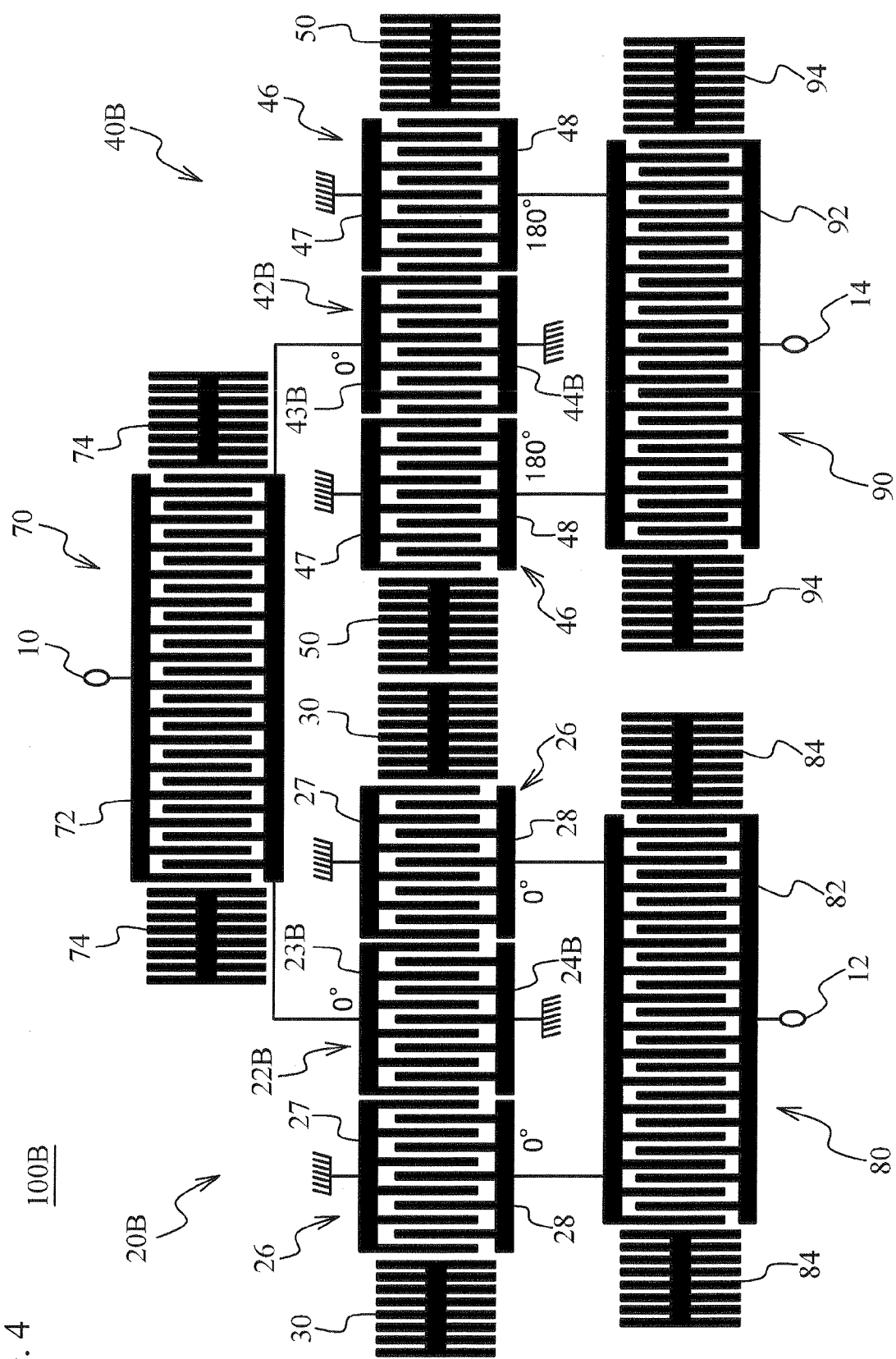
FIG. 4 is a schematic view of a SAW device in accordance with a second embodiment.

FIG. 4 is a top view of a SAW device 100B in accordance with the second embodiment. Same reference numerals are assigned to common components with the first embodiment, and detail descriptions are omitted. A first resonator 70 is connected between the unbalanced terminal 10 and a first filter 20B and between the unbalanced terminal 10 and a second filter 40B. The first resonator 70 includes a pair of IDTs 72, and reflectors 74 located on either side of IDTs 72. In the same manner, a second resonator 80 including IDTs 82 and reflectors 84 is connected between the first balanced terminal 12 and the first filter 20B. A third resonator 90 including IDTs 92 and reflectors 94 is connected between the second balanced terminal 14 and the second filter 40B. It is possible to reduce an out-of-band noise (increase an attenuation) by combining resonators to filters.

Compositions of the first filter 20B and the second filter 40B in the second embodiment are same as those of the first embodiment (FIG. 2). Thus, the number of electrode fingers of an input electrode 23B is greater than the number of electrode fingers of a ground electrode 24B, and the total number of electrode fingers in the IDT is an odd number in a first input IDT 22B. In a second input IDT 42B, the number of electrode fingers of an input electrode 43B is same as that of a ground electrode 44B, and the total number of electrode fingers in the IDT is an even number.

A description will now be given of compositions of SAW devices in accordance with comparative embodiments (second through fourth comparative embodiments) to the second embodiment. In following comparative embodiments, compositions of input IDTs (a first input IDT 22 and a second input IDT 42) in two filters (a first filter 20 and a second filter 40) are different from those of the second embodiment, but other basic compositions are common with those of the second embodiment.

Figure 5:
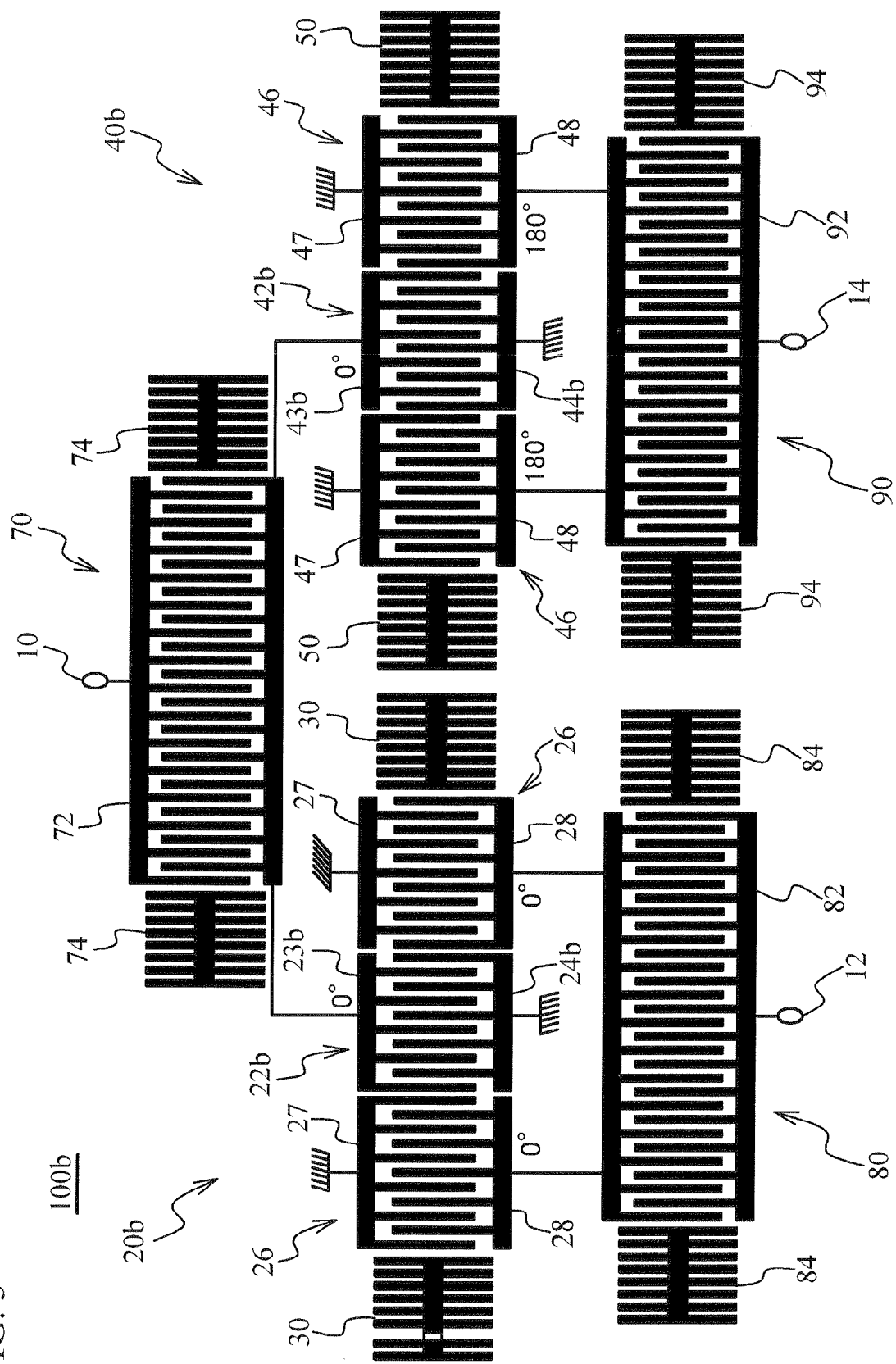
FIG. 5 is a schematic view of a SAW device in accordance with a second comparative embodiment.

FIG. 5 is a top view of a SAW device 100b in accordance with a second comparative embodiment. The number of electrode fingers of an input electrode 23b is same as that of a ground electrode 24b in a first input IDT 22b, the number of electrode fingers of an input electrode 43b is same as that of a ground electrode 44b in a second input IDT 42b, and the total number of electrode fingers in each IDT is an even number.

Figure 6:
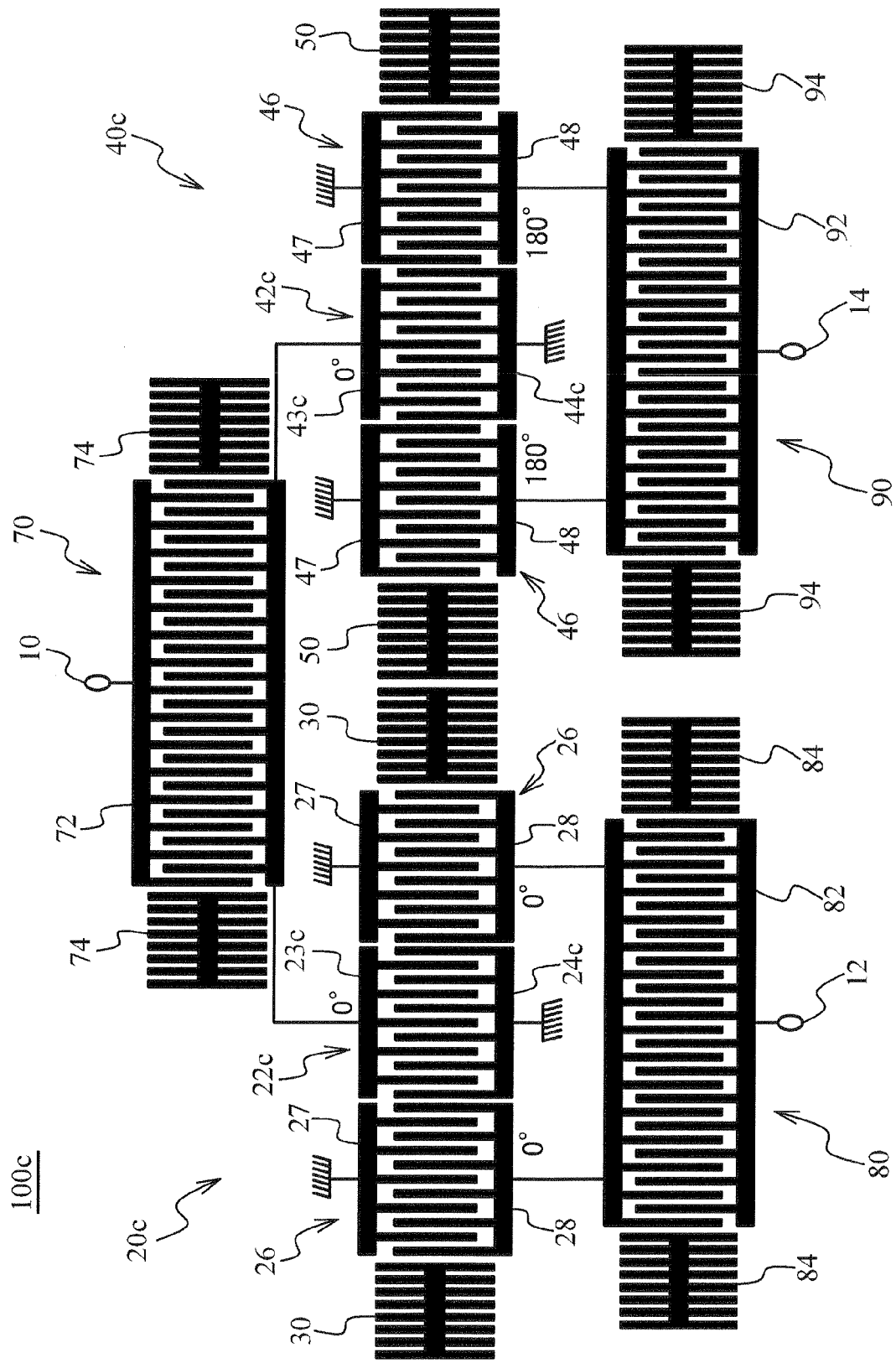
FIG. 6 is a schematic view of a SAW device in accordance with a third comparative embodiment.

FIG. 6 is a top view of a SAW device 100c in accordance with a third comparative embodiment. The number of electrode fingers of a ground electrode 24c is same as that of an input electrode 23c in a first input IDT 22c, the number of electrode fingers of a ground electrode 44c is same as that of an input electrode 43c in a second input IDT 42c, and the total number of electrode fingers in each IDT is an odd number.

Figure 7:
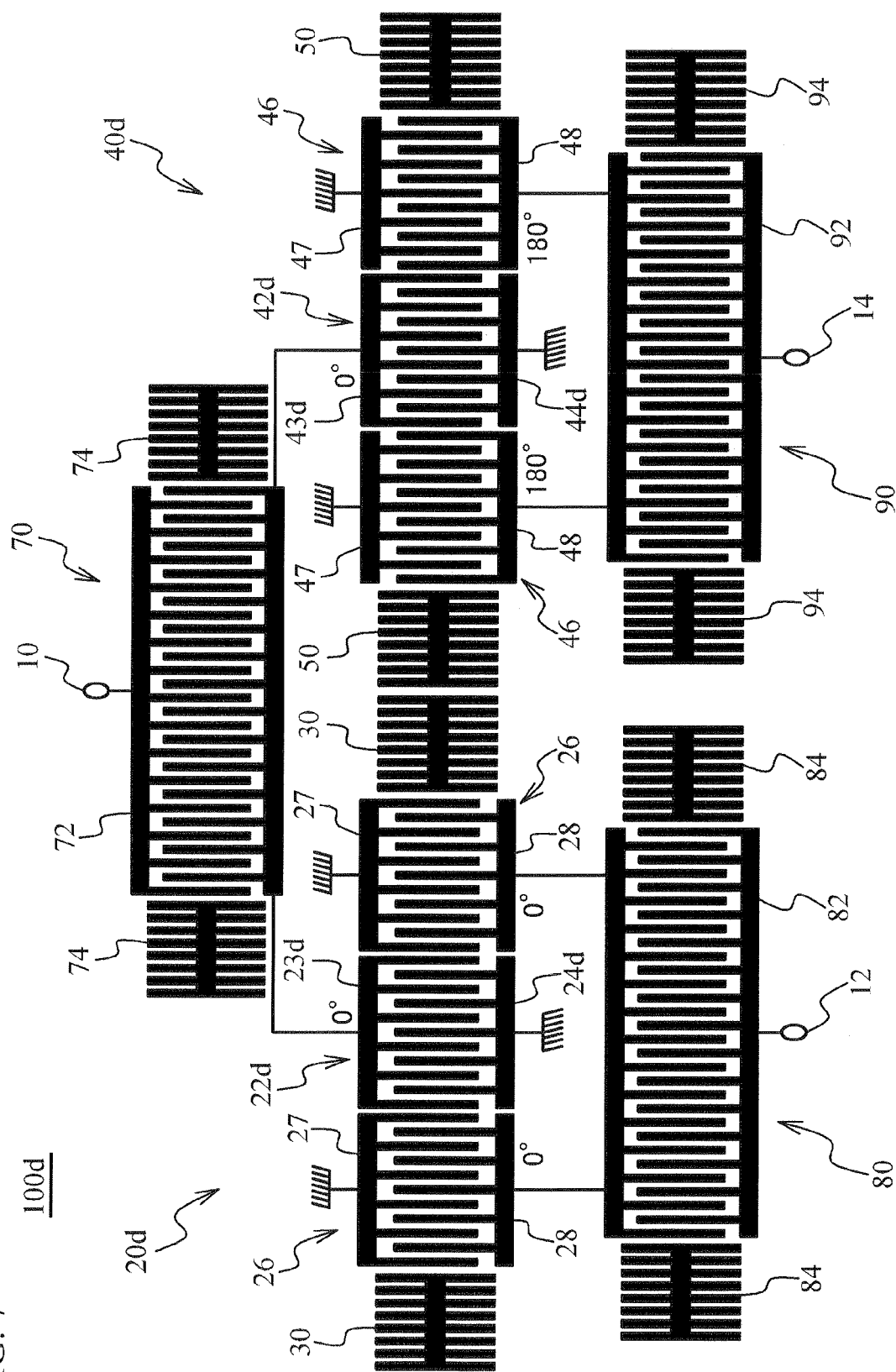
FIG. 7 is a schematic view of a SAW device in accordance with a fourth comparative embodiment.

FIG. 7 is a top view of a SAW device 100d in accordance with a fourth comparative embodiment. In both a first input IDT 22d and a second input IDT 42d, the total number of electrode fingers in the IDT is an odd number as same with the third comparative embodiment. However, the number of electrode fingers of an input electrode 23d is greater than that of a ground electrode 24, and the number of electrode fingers of an input electrode 43d is greater than that of a ground electrode 44d.

A description will now be given of a comparison among transmission characteristics of SAW devices in accordance with the second embodiment and second through fourth comparative embodiments on the basis of measured values. Basic parameters such as materials of the piezoelectric substrate and the electrode are same as those shown in Table 1. The numbers of electrode fingers of the input IDT and the output IDT in each filter, and an aperture between two filters are as shown in Table 2. Each parameter of the second embodiment is same as that of the first embodiment. Each parameter of the second comparative embodiment is same as that of the first comparative embodiment. Most parameters of third and fourth comparative embodiments are same as those of first and second comparative embodiments, but differ from the first comparative embodiment in that the numbers of electrode fingers of input IDTs 22 and 42 are 27.5 pairs.

The number of IDT pairs, the IDT pitch, the number of reflectors, the reflector pitch, and the aperture of the resonator in the first resonator 70, the second resonator 80, and the third resonator are as follows in the second embodiment.

TABLE 3

|  | FIRST RESONATOR | SECOND RESONATOR | THIRD RESONATOR |
| --- | --- | --- | --- |
| NUMBER OF IDT PAIRS (SECOND EMBODIMENT) | 200 PAIRS | 102.5 PAIRS | 90 PAIRS |
| IDT PITCH (SECOND EMBODIMENT) | 2.13 μm | 2.13 μm | 2.12 μm |
| NUMBER OF REFLECTORS (SECOND EMBODIMENT) | 10 | 10 | 10 |
| REFLECTOR PITCH (SECOND EMBODIMENT) | 2.13 μm | 2.13 μm | 2.12 μm |
| APERTURE (SECOND EMBODIMENT) | 70 μm | 75 μm | 64 μm |

In the same manner, parameters of resonators of second through fourth comparative embodiments are shown as follows.

TABLE 4

|  | FIRST RESONATOR | SECOND RESONATOR | THIRD RESONATOR |
| --- | --- | --- | --- |
| NUMBER OF IDT PAIRS (SECOND THROUGH FOURTH COMPARATIVE EMBODIMENTS) | 200 PAIRS | 100 PAIRS | 100 PAIRS |
| IDT PITCH (SECOND THROUGH FOURTH COMPARATIVE EMBODIMENTS) | 2.13 μm | 2.12 μm | 2.12 μm |
| NUMBER OF REFLECTORS (SECOND THROUGH FOURTH COMPARATIVE EMBODIMENTS) | 10 | 15 | 15 |
| REFLECTOR PITCH (SECOND THROUGH FOURTH COMPARATIVE EMBODIMENTS) | 2.13 μm | 2.12 μm | 2.12 μm |
| APERTURE (SECOND THROUGH FOURTH COMPARATIVE EMBODIMENTS) | 70 μm | 74 μm | 74 μm |

Figure 8:
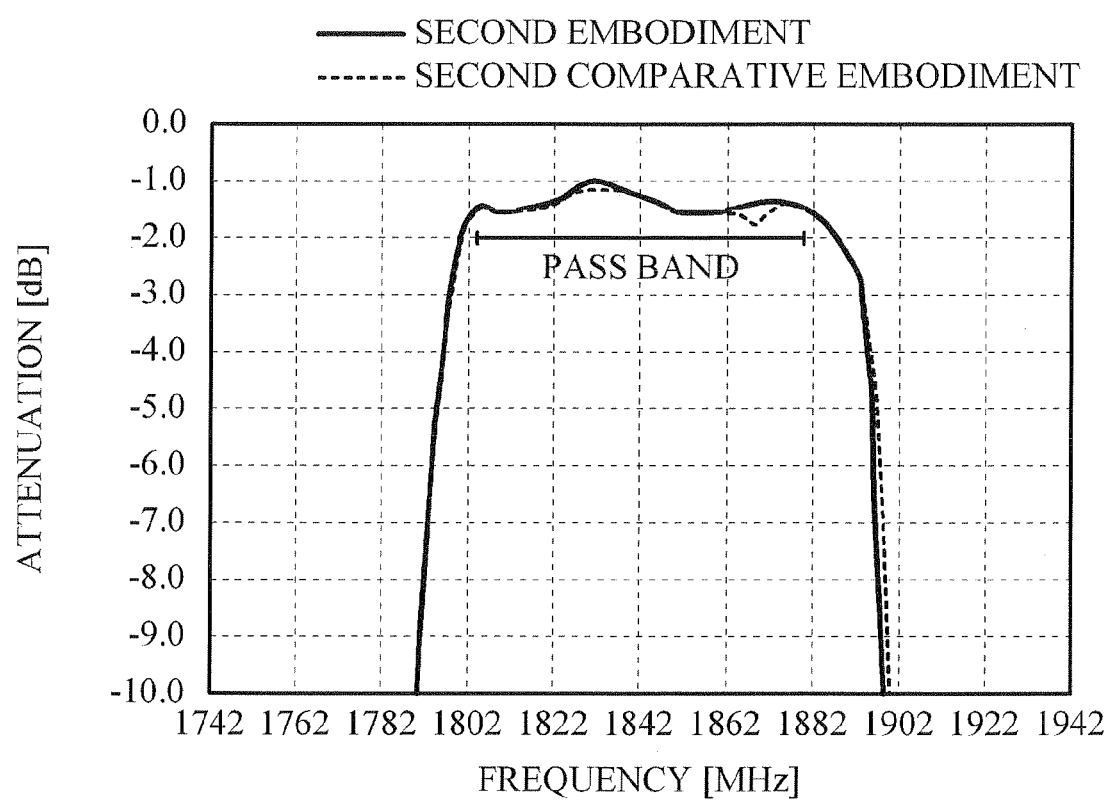
FIG. 8 is a graph illustrating a comparison between transmission characteristics of SAW devices in the second embodiment and the second comparative embodiment.
Figure 9:
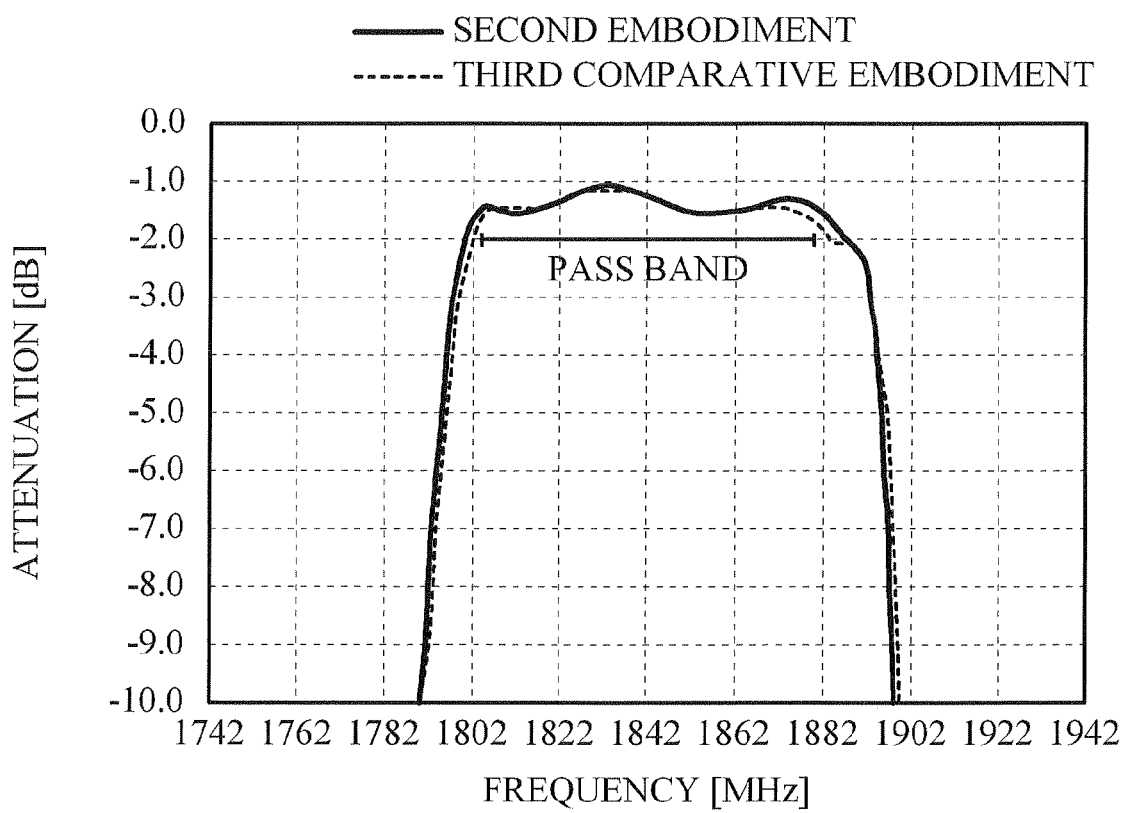
FIG. 9 is a graph illustrating a comparison between transmission characteristics of SAW devices in the second embodiment and the third comparative embodiment.
Figure 10:
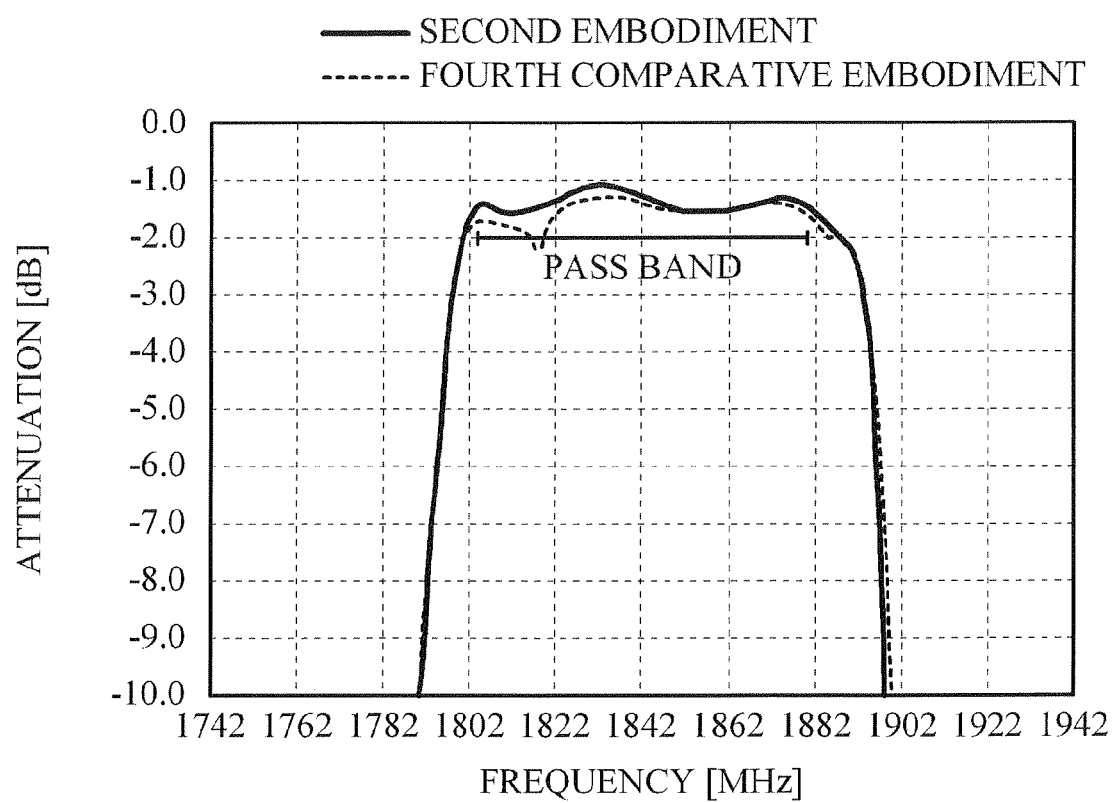
FIG. 10 is a graph illustrating a comparison between transmission characteristics of SAW devices in the second embodiment and the fourth comparative embodiment.

FIGS. 8 through 10 are graphs illustrating comparisons among transmission characteristics of SAW devices in the second embodiment and second through fourth comparative embodiments. FIG. 8 shows a comparison between the second embodiment and the second comparative embodiment, FIG. 9 shows a comparison between the second embodiment and the third comparative embodiment, and FIG. 10 shows a comparison between the second embodiment and the fourth comparative embodiment. As shown in each graph, a notch is suppressed in the second embodiment compared to second through fourth comparative embodiments. As described above, according to the SAW device 100B of the second embodiment, it is possible to suppress an in-band notch, and reduce an insertion loss.

[Third Embodiment]

A third embodiment is an example of a SAW device where resonators are combined to filters as same with the second embodiment.

Figure 11:
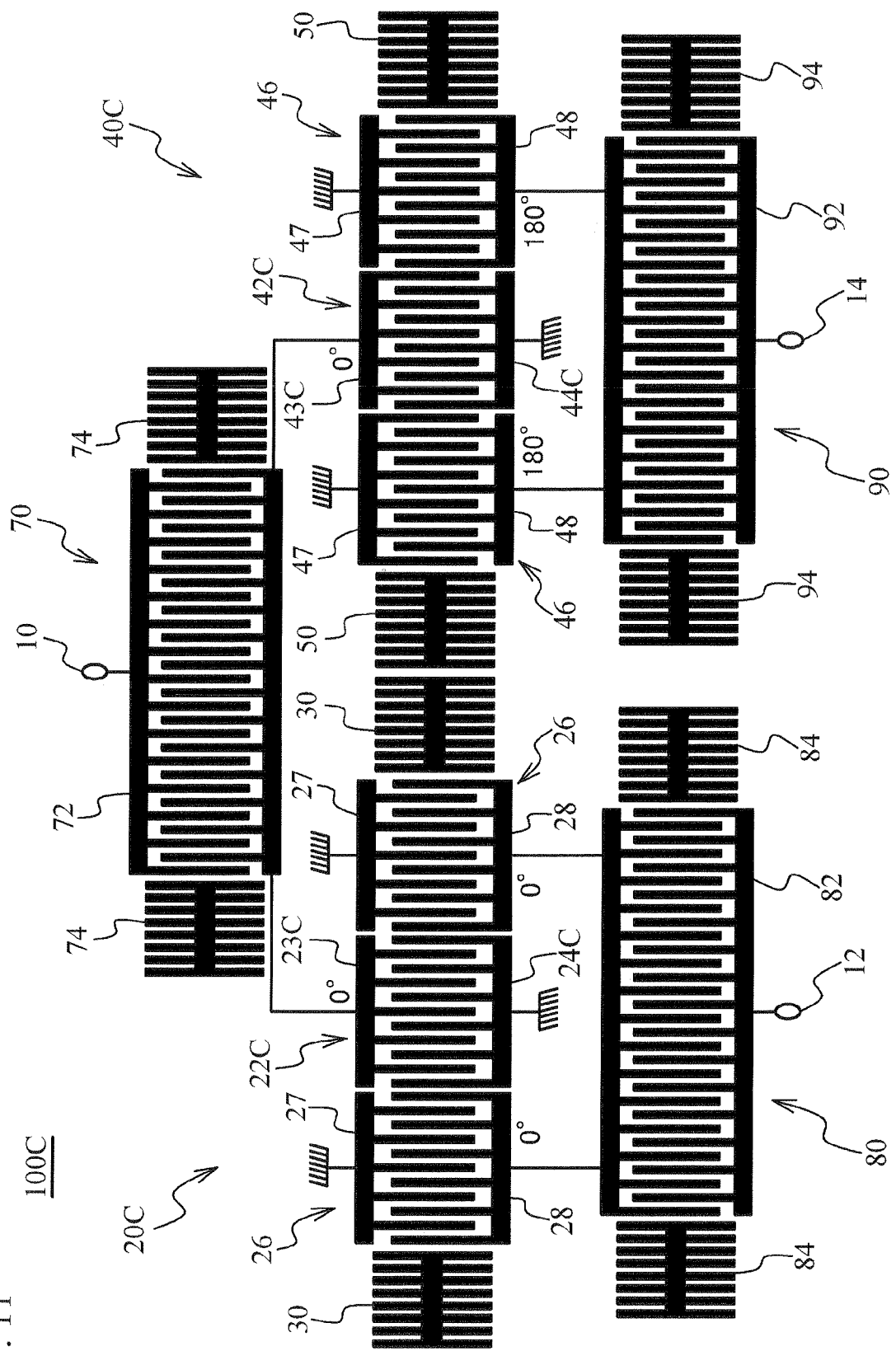
FIG. 11 is a schematic view of a SAW device in accordance with a third embodiment.

FIG. 11 is a top view of a SAW device 100C in accordance with the third embodiment. A basic composition of the SAW device 100C is same as that of the SAW device 100B in accordance with the second embodiment. Thus, same reference numerals are assigned to common components with the second embodiment, and detail descriptions are omitted.

The composition of a first input IDT 22C in a first filter 20C of the SAW device 100C differs from the first input IDT 22B in the first filter 20B of the second embodiment. More specifically, the total number of electrode fingers in the first input IDT 22C is an odd number as same with the second embodiment, but the number of electrode fingers of the ground electrode 24 is greater than that of an input electrode 23C. Other compositions (compositions of first output IDTs 26, a second filter 40C, the first resonator 70, the second resonator 80, and the third resonator 90) are same as those of the second embodiment.

Transmission characteristics of the SAW device 100C will be described on the basis of measured values. Basic parameters such as materials of the piezoelectric substrate and the electrode are same as those shown in Table 1. Parameters of the first filter 20C and the second filter 40C are as shown in Table 2 in the third embodiment. Parameters of resonators are shown as follows.

TABLE 5

| | FIRST RESONATOR | SECOND RESONATOR | THIRD RESONATOR |
|---|---|---|---|
| NUMBER OF IDT PAIRS (THIRD EMBODIMENT) | 200 PAIRS | 112 PAIRS | 90 PAIRS |
| IDT PITCH (THIRD EMBODIMENT) | 2.13 μm | 2.13 μm | 2.12 μm |
| NUMBER OF REFLECTORS (THIRD EMBODIMENT) | 10 | 10 | 10 |
| REFLECTOR PITCH (THIRD EMBODIMENT) | 2.13 μm | 2.13 μm | 2.12 um |
| APERTURE (THIRD EMBODIMENT) | 70 μm | 75 μm | 68 μm |

Figure 12:
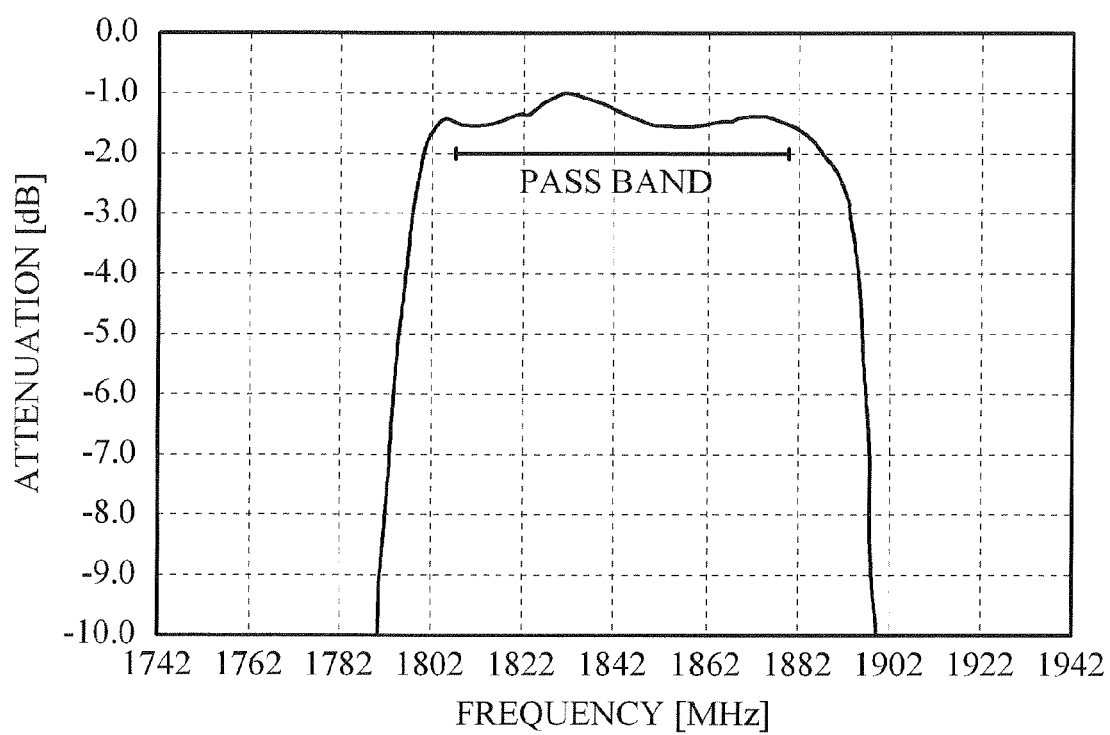
FIG. 12 is a graph illustrating transmission characteristics of the SAW device in accordance with the third embodiment.

FIG. 12 is a graph illustrating transmission characteristics of the SAW device 100C. According to the SAW device 100C in accordance with the third embodiment, it is possible to suppress an in-band notch, and reduce an insertion loss, as same with the second embodiment.

Figure 13:
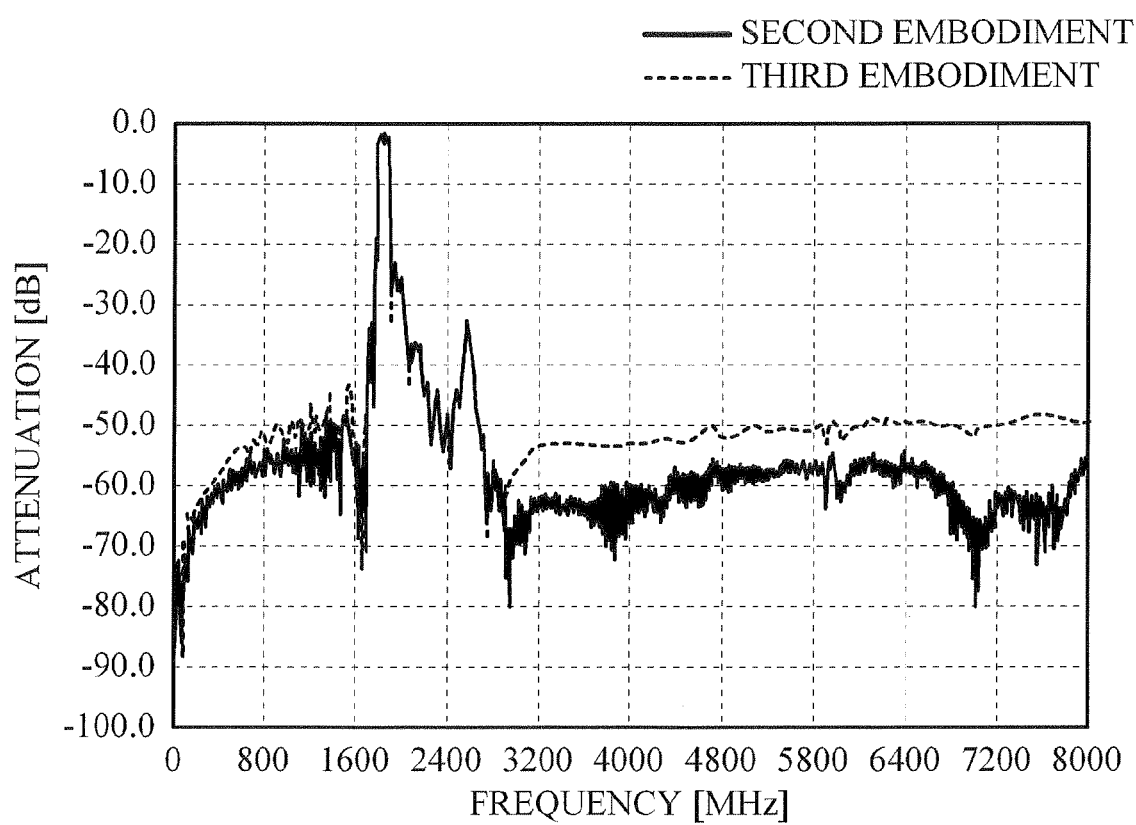
FIG. 13 is a graph illustrating a comparison between attenuation characteristics of SAW devices in the second embodiment and the third embodiment.

FIG. 13 is a graph indicating comparisons of pass characteristics and attenuation characteristics between SAW devices in the second embodiment and the third embodiment. As illustrated, there is little difference between the second embodiment and the third embodiment in pass characteristics. However, the second embodiment is superior to the third embodiment in attenuation characteristics. Therefore, when the number of electrode fingers of the first input IDT 22 in the first filter 20 is an odd number, it is preferable to make the number of electrode fingers of an input electrode 23 connected to the unbalanced terminal 10 greater than the number of electrode fingers of the other one (the ground electrode 24).

In first through third embodiments, it is preferable to make at least one of the number of electrode fingers, the aperture length, and the electrode pitch of first output IDTs 26 locating on either side of the first input IDT 22 different from that of second output IDTs 46 locating on either side of the second input IDT 42. The balance seems good when the first filter 20 and the second filter 40 have symmetric compositions, but it is possible to reduce an insertion loss by designing parts other than input IDTs (22 and 42) to be asymmetric in fact.

In second and third embodiments, it is preferable to make at least one of the number of electrode fingers, the aperture length, and the electrode pitch of the IDT included in the second resonator 80 different from that of the IDT included in the third resonator 90. It is possible to reduce an insertion loss more by designing two resonators connected to the balanced terminal side of two filters 20 and 40 to be asymmetric.

The first filter 20, each of the second filter 40, the first resonator 70, the second resonator 80, and the third resonator 90 may be formed on different substrates, but it is preferable to be formed on the same piezoelectric substrate. In first through third embodiments, LiTaO$_3$ is used as the piezoelectric substrate, but a substrate composed of other materials (e.g. LiNbO$_3$) may be used. Al electrodes are used as electrodes, but electrodes composed of other materials (e.g. Cu) may be used. In first through third embodiments, descriptions are given by using a DMS filter as an example. However, it is possible to apply the present invention to other multimode filters. In first through third embodiments, each number of IDTs included in the first filter 20 and the second filter 40 is three, but other numbers that are an odd number and more than three are possible.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:

1. A surface acoustic wave device comprising:
a first filter and a second filter, each of them being a surface acoustic wave (SAW) filter including an odd number of at least three InterDigital Transducers (IDTs) respectively;
an unbalanced terminal to which an unbalanced signal is input;
a first balanced terminal from which a signal having a same phase as the unbalanced signal is output; and
a second balanced terminal from which a signal having an opposite phase to the unbalanced signal is output,
wherein one of electrodes of a first center IDT and one of electrodes of a second center IDT are commonly connected to the unbalanced terminal, the first center IDT and the second center IDT being one out of the odd number of IDTs and located at a center in the first filter and the second filter respectively;
one of electrodes in each of two IDTs located on either side of the first center IDT is commonly connected to the first balanced terminal;
one of electrodes in each of two IDTs located on either side of the second center IDT is commonly connected to the second balanced terminal;
the number of electrode fingers of the first center IDT is an odd number; and
the number of electrode fingers of the second center IDT is an even number,
wherein the two IDTs located on either side of the first center IDT are separated from the first center IDT, and the two IDTs located on either side of the second center IDT are separated from the second center IDT,
wherein the number of electrode fingers of an electrode, which is one of electrodes constructing the first center IDT and is connected to the unbalanced terminal, is greater than the number of electrode fingers of another electrode constituting the first center IDT.

2. The surface acoustic wave device according to claim 1, wherein the first filter and the second filter are a multimode filter.

3. The surface acoustic wave device according to claim 1, wherein at least one of the number of electrode fingers, an aperture length, and an electrode pitch is different from each other between two IDTs located on either side of the first center IDT and two IDTs located on either side of the second center IDT.

4. The surface acoustic wave device according to claim 1, wherein the first filter and the second filter is formed on a same piezoelectric substrate.

5. The surface acoustic wave device according to claim 1, further comprising:
   a first resonator connected between the unbalanced terminal and the first filter, and between the unbalanced terminal and the second filter;
   a second resonator connected between the first balanced terminal and the first filter; and
   a third resonator connected between the second balanced terminal and the second filter.

6. The surface acoustic wave device according to claim 5, wherein each of the first resonator, the second resonator, and the third resonator includes an IDT, and reflectors located on either side of the IDT.

7. The surface acoustic wave device according to claim 6, wherein at least one of the number of electrode fingers, an aperture length, and an electrode pitch of the IDT included in the second resonator is different from that of the third resonator.

* * * * *